United States Patent
Rajsuman et al.

(10) Patent No.: US 6,678,645 B1
(45) Date of Patent: Jan. 13, 2004

(54) METHOD AND APPARATUS FOR SOC DESIGN VALIDATION

(75) Inventors: Rochit Rajsuman, Santa Clara, CA (US); Hiroaki Yamoto, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/428,746

(22) Filed: Oct. 28, 1999

(51) Int. Cl.$^7$ .............................................. G06F 17/50
(52) U.S. Cl. ............................ 703/20; 714/33; 714/39; 714/735; 714/736; 714/737; 714/741; 714/742; 703/14; 703/15; 703/17; 703/16; 716/4; 716/16; 716/17; 716/18
(58) Field of Search ............................. 703/20, 21, 22, 703/23, 24, 25, 26–28, 15, 17, 19, 18; 716/18, 4, 5, 6, 16, 17; 712/28, 35; 714/33, 39, 735, 737, 736, 741, 742

(56) References Cited

U.S. PATENT DOCUMENTS

| | | | | |
|---|---|---|---|---|
| 5,801,958 A | * | 9/1998 | Dangelo et al. | 716/18 |
| 5,903,475 A | * | 5/1999 | Gupte et al. | 703/16 |
| 6,009,256 A | * | 12/1999 | Tseng et al. | 703/13 |
| 6,094,726 A | * | 7/2000 | Gonion et al. | 712/221 |
| 6,269,467 B1 | * | 7/2001 | Chang et al. | 716/1 |
| 6,304,837 B1 | * | 10/2001 | Geiger et al. | 703/14 |
| 6,360,353 B1 | * | 3/2002 | Pember et al. | 716/4 |
| 6,532,561 B1 | * | 3/2003 | Turnquist et al. | 714/738 |

OTHER PUBLICATIONS

Rochit Rajsuman, "Design–for–Iddq–Testing for Embedded Cores Based System–on–a–Chip," 1998 IEEE International Workshop on IDDQ Testing, 1998. Proceedings. pp.: 69–73.*

Pankaj Chauhan, Edmund Clarke, Yuan Lu, and Dong Wang, "Verifying IP–Core Based System–On–Chip Designs," Twelfth Annual IEEE International ASIC/SOC Conference, 1999. Proceedings, pp.: 27–31.*

* cited by examiner

Primary Examiner—W. Thomson
(74) Attorney, Agent, or Firm—Muramatsu & Associates

(57) ABSTRACT

A method and apparatus for validating SoC (system-on-a-chip) design with high accuracy and speed and low cost. The [apparatus allows to use a] method [which] includes the steps of verifying individual cores to be integrated in an SoC by evaluating a silicon IC having a function and structure identical to that of each core constituting the SoC with use of test patterns generated based on simulation testbenches produced through a design stage of the cores; verifying interfaces between the individual cores, on-chip buses of the cores and glue logic by using the silicon ICs and simulation testbenches [developed by an SoC designer] and FPGA/emulation of the glue logic; verifying core-to-core timings and SoC level timing critical paths; and performing an overall design validation by using the silicon ICs and simulation testbenches of [an] the overall SoC [and application runs].

33 Claims, 10 Drawing Sheets

METHOD AND APPARATUS FOR SOC DESIGN VALIDATION

FIELD OF THE INVENTION

This invention relates to a method and apparatus for examining design integrity of an SoC (System-on-a-Chip) IC having a plurality of functional cores, and more particularly, to a method and apparatus for SoC design validation in which design validation can be evaluated as to an intended function of each core, timings in each core, interface among the cores, and an overall system operation of the SoC IC.

BACKGROUND OF THE INVENTION

In the last 5-years, ASIC technology has evolved from a chip-set philosophy to an embedded core based system-on-achip (SoC) concept. These system-chips are built using predesigned models of complex functions known as "cores" (also known as Intellectual Property or IP) that serve a variety of applications. These cores are generally available either in high-level description language (HDL) such as in Verilog/HDL (known as soft-core), or in transistor level layout such as GDSII (known as hard-core). A system-chip may contain combinations of hard and soft cores for on-chip functions such as microprocessors, large memory arrays, audio and video controllers, modem, internet tuner, 2D and 3D graphics controllers, DSP functions, and etc.

Many times, these cores are purchased from core provider companies and integrated together to make an SoC. When a core is purchased from outside, the core provider provides the design netlist along with the simulation testbench of the core. Thus, when the core is integrated in an SoC, it is desirable to directly apply the core's testbench without any modification to verify its operation in the integrated SoC design.

At the present time, design is described in blocks and sub-blocks using a high-level language such as Verilog/VHDL and simulated by behavioral/gate-level Verilog/VHDL simulators. Such simulation is targeted to check the functionality before design is fabricated into a silicon IC. Design validation is one of the most important and difficult tasks in SoC design because without full functional verification design errors are neither found nor removed. Because of the slow simulation speed and large size of SoC design, SoC level design validation is almost an impossible task with the present day tools and methodologies.

Verification implies checking against an accepted entity. For system design, it means checking the design against the specification. Verification is done to verify that, during system design, the translation from one abstraction level to other is correct. The objective is to find out, within the practical limits, whether the system will work as intended after implementation and manufacturing the design. System-on-a-chip is a single hardware component with multiple embedded cores. Hence, design validation of SoC consists of verification of cores, verification of interconnects among the cores and verification of the combined system operation.

At the present time, along with the development of SoC specification, behavioral models are developed so that simulation testbenches can be created for design validation or the verification of the system operation. The system level verification is done based on the design hierarchy. First, the leaf level blocks, normally at the core level, are checked for correctness in a stand-alone way. Then, the interfaces between those cores are checked for correctness in terms of transaction types and in data contents. The next step is to run application software or equivalent testbenches on the fully assembled chip. This involves hardware/software co-verification (M. Keating and P. Bricaud, "Reuse methodology manual", Kluwer Academic Press, 1998; J. Stcunstrub and W. Wolf, "Hardware-software co-design", Kluwer Academic Press, 1997). Software can only be verified by runtime executions of the software code, and therefore, a hardware-software co-simulation has to be performed. Often a hardware prototype either in ASIC (application specific IC) form or using FPGAs (field programmable gate arrays) is also developed and used for the verification of the overall system operation.

Functional Verification

FIG. 1 illustrates the core design at different levels of abstraction and what type of verification methodology is used today at each level. From the highest to lowest abstraction levels, FIG. 1 shows behavioral HDL level 21, RTL (register transfer language) level 23, gate level 25 and physical design level 27. Verification methods corresponding to such different abstraction levels are listed in a block 28 of FIG. 1. The basic types of verification tests may include the following:

(1) Compliance testing which is testing to confirm compliance to design specification.
(2) Corner testing which is testing for complex scenarios and corner cases such as in the minimum and maximum conditions in voltage, temperature and process.
(3) Random testing which is basically non-targeted testing that could detect very obscure bugs.
(4) Real code testing which is done by running a real application on the design so that any misrepresentation in functionality can be corrected.
(5) Regression testing which is done by running a collection of tests after any modification in the design. Each bug fix generally requires addition of a new test case with additional test conditions.

Development of testbench depends on the function of the core and the target SoC. For example, a testbench for a processor would execute a test program based on its instruction set, while a testbench for a bus controller interface core, such as a PCI core, would use bus functional models and bus monitors to apply stimulus and check the simulation output results. The problem in this approach is that the behavioral testbenches are extremely slow.

After generating the test cases (stimulus or pattern), it is required to check whether the output responses are correct or not. Today, it is done manually by looking at the output waveform, but as changes occur to the design, this manual checking becomes impossible. Another way to verify output responses is to run the actual software application, which is basically a hardware/software co-simulation. This approach is very inefficient in today's computational resources. Further in such a testbench, actual transactions between the application and core are only a small fraction of the total cycles being simulated. Hence, only a small fraction of functionality is verified.

Interface Verification

In SoC design, the interfaces between the cores need to be verified. Usually the interfaces have a regular structure with address and data connecting the cores either core-to-core or on-chip global buses. The interfaces also have some form of control mechanism and signals such as request/grant protocol and bus controller. The regular structure of these interfaces can be defined by the transaction of limited number of sequences of data and control signals.

Interface verification requires a list of all possible transactions at each interface, thus, it is an impossible task because all possible test cases cannot be generated. Thus, limited verification is done. After this limited verification, the next task is to verify that the core behaves correctly for all values of data and for all sequences of data that each core would receive. Such verification is again impossible, hence, a grossly incomplete verification is done today because all different data values in a transaction are prohibitively too large.

Timing Verification

Timing verification is even harder task than functional verification. Static timing analysis is the most widely available method today. Static timing analysis is performed on representative netlist of cores that have been synthesized with various technology libraries. Static timing analysis tends to be pessimistic because false paths are not properly filtered out. Removal of false paths is a manual process and thus, it is subjected to errors. Gate-level simulation provides a reasonable check for these types of errors but it is not a complete solution since it would take excessive amount of time to develop stimulus and to simulate all the timing paths at the gate-level. Also, the worst case timing scenarios are not exercised in gate-level simulation, since they are too complex and numerous to be identified properly by the design engineer.

Full SoC Design Validation

The main goal of SoC design validation is to verify the entire system the way it would be used by the end user. This requires full functional models of all cores (i.e. hardware models) and a reasonable amount of real system applications. If it is a new system, such applications may not exist. The major issue is the simulation speed. For example, even at RTL (register transfer language) level, booting up an operating system on a processor takes hours. To improve the simulation speed, one of the two methods is used; (a) higher level of abstractions to run the simulations faster, or (b) prototyping or emulation in hardware.

For higher abstraction models, RTL models are used for the functional cores, behavioral or ISA (instruction set architecture) models for memory and processor cores and bus functional models and monitors are used to generate and check transactions with communications blocks. For SoC such as a media processor, application codes are generated to run on it in the simulation environment. Very little can be done when applying software applications, it is limited to checking if the silicon (SoC chip) is functioning or completely dead and to find basic bugs. Today, errors are detected manually using bus monitors or by a sequence checker/monitor on the communications interfaces. However, the simulation speed is extremely slow, approximately 10 cycles per second that is too slow to run any reasonable size application.

When hardware and software are simulated in a concurrent way, it is called co-simulation. Hardware can be modeled in a C language function and the entire system can be executed like a single C language program. However, this is not design validation because it is not at the implementation level, but rather, it is a behavioral verification or a feasibility study. HDL/RTL description is required for the entire system validation since it represents the implementation of hardware components. Co-simulation requires communication between one or more HDL simulators and C/C++ programs (requiring a compiler, loader, linker and other pieces from the computer operating system). Thus, the additional problem in the co-simulation is the communication between different simulators.

Hardware Prototyping

All design teams attempt to make the first silicon fully functional, but more than 50% designs fail when put into the system for the first time. This is due to lack of system level verification or SoC level design validation. To reliably achieve success in the first attempt, more and more real applications should be simulated. As simulation time became unreasonably long, the only practical solution today is using silicon prototypes although it costs significantly. The available techniques are FPGA/LPGA and emulation.

For smaller designs, an FPGA (field programmable gate array) or LPGA (laser programmable gate array) prototype can be made. Although FPGA and LPGA lack the gate count capacity and speed of ASICs, they are good for smaller blocks or cores, but not suitable for the entire SoC. Several FPGAs can be interconnected on a circuit board and used to build a prototype of the entire SoC. In this case, if a bug fix requires re-partitioning of the SoC chip, interconnects between FPGAs would be changed, requiring a new circuit board, and hence the modifications are expensive and takes significant amount of time.

Emulation technology provides an alternative to a collection of FPGAs for large chips. It provides programmable interconnect, fixed board designs, relatively large gate counts and special memory and processor support. Emulation can give faster performance than the simulation if the entire design can be loaded into the emulation engine itself. However, it is still significantly slow in the execution speed compared to actual silicon. The emulation performance further degrades if a significant portion of the chip data or the testbench data is loaded on the host computer. The additional drawback of this method is its cost. All commercially available emulation systems today cost more than one million dollars.

When the design is too large (multi-million transistors), building a real silicon prototype and debug in the final system is the only available method today. In this situation, same silicon can be used for first several bugs without new silicon run. The whole process requires 2–3 silicon runs (fabrication cycles), while each run adds significant cost to the overall product development.

As in the foregoing, the existing technology cannot effectively test and validate SoC design in terms of performance, cost and speed. Therefore, there is a need in the semiconductor industry for a new method and apparatus which is capable of performing thorough SoC design validation with high speed and low cost.

SUMMARY OF THE INVENTION

Therefore, it is an object of the present invention to provide a method and apparatus for SoC design validation which is capable of performing thorough SoC design validation on each core function, interconnection between the cores, and entire system performance.

It is another object of the present invention to provide a method and apparatus for SoC design validation which is capable of performing thorough SoC design validation with high speed and low cost.

It is a further object of the present invention to provide a design validation station wherein SoC design validation is conducted to verify the overall functionality of the SoC.

It is a further object of the present invention to provide a method and apparatus which allows a user to debug a fault in the cores of the SoC much more easily than the present day systems.

The present invention provides a new method and apparatus for design validation or full functional verification that solves the present day difficulties of design validation of embedded cores based system-on-a-chip ICs. The inventors call it a "design validation station" because it is used to verify the overall functionality of the SoC. The system architecture described in this application is very efficient, less costly and fundamentally different than any previously described system.

One aspect of the present invention is a method for design validation of an embedded cores based SoC (system-on-a-chip) in which a plurality of functional cores are integrated. This method includes the steps of: verifying individual cores to be integrated in an SoC[,] by using a physical silicon IC of each core and simulation testbenches [provided by a core provider] of each core; verifying interfaces between the individual cores, on-chip buses of the cores and glue logic [using] by using the silicon IC and simulation testbenches [developed by an SoC designer] and FPGA/emulation of the glue logic; verifying core-to-core timings and SoC level timing critical paths; and performing an overall design validation by using the silicon ICs and simulation testbenches of an overall SoC and application runs.

Another aspect of the present invention is an apparatus for design validation of the SoC. The apparatus includes a main system computer for interfacing with a user and controlling the overall operation of the apparatus for design validation, a plurality of verification units each of which receives testbench data from the main system computer and generates test patterns using the testbench data for testing a plurality of [functional] physical ICs (rather than simulated cores) having functions of the cores to be integrated in an SoC, and a system bus interfacing the main system computer with the plurality of verification units. In the apparatus of the present invention, a plurality of silicon ICs are connected to the verification units to receive the test pattern from the verification units and [generates] to generate response outputs [to be] that are evaluated by the verification units and main system computer, wherein each of the silicon ICs carries an inner structure and function identical to that of the corresponding functional core to be integrated in the SoC.

DETAILED DESCRIPTION OF THE PREFERRED EMBODIMENT

Figure 1:
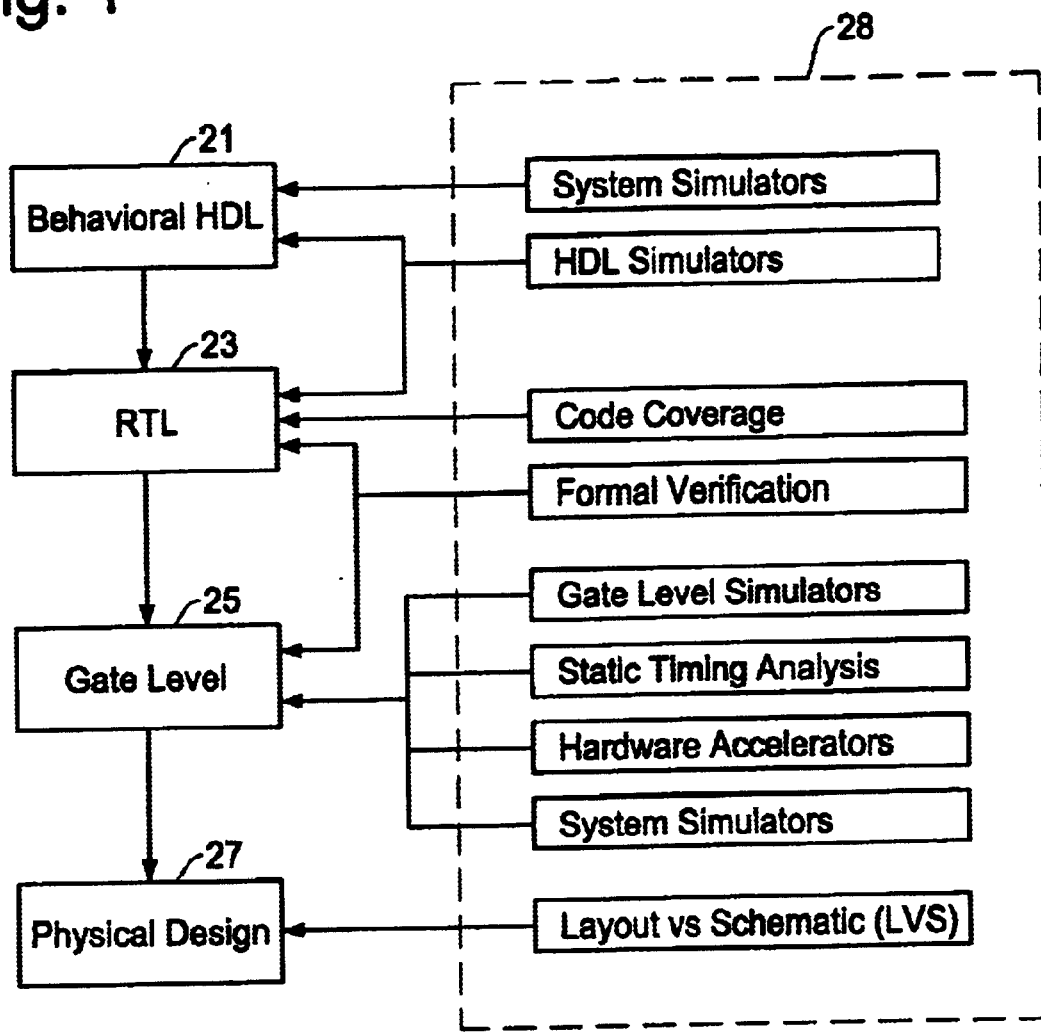
FIG. 1 is a diagram showing levels of abstraction and associated verification methods in the design of functional cores and verification of the design.
Figure 2:
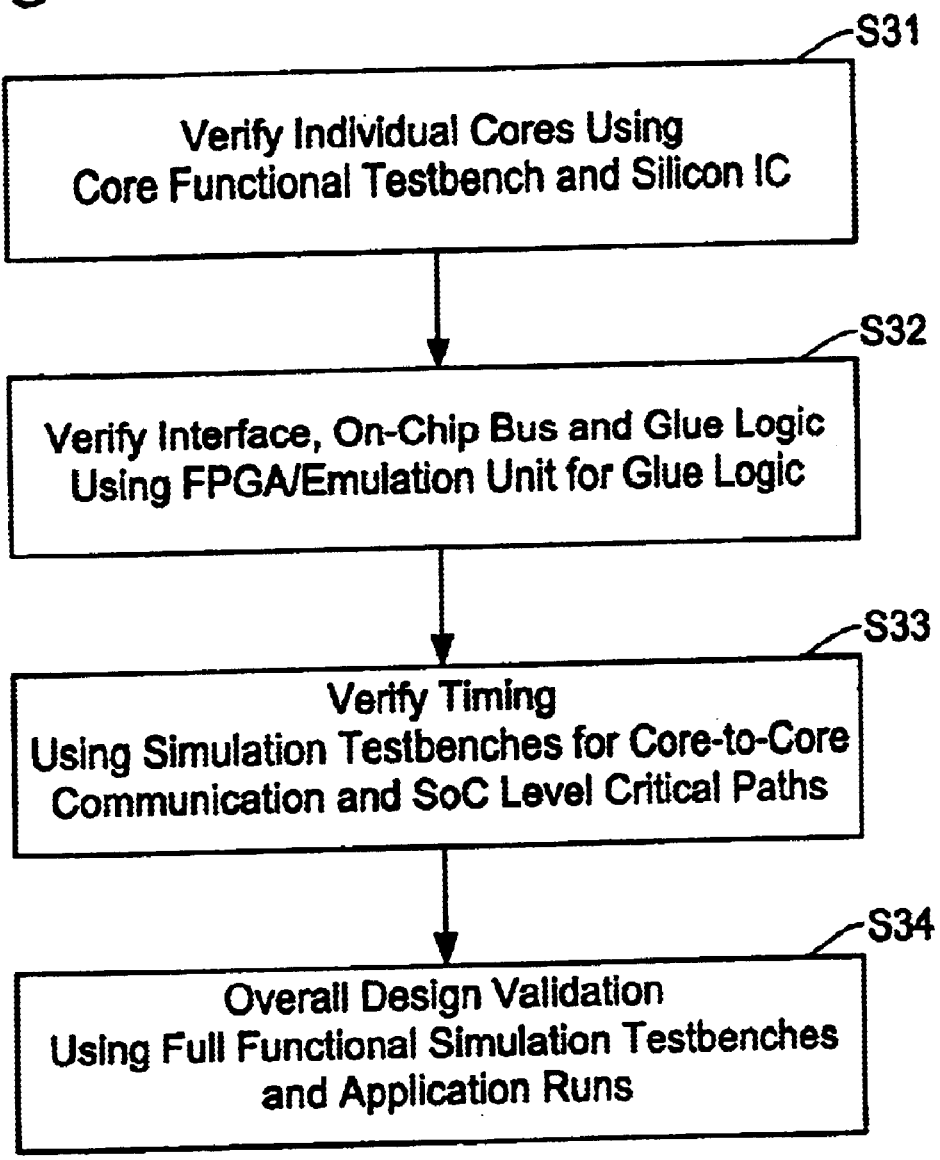
FIG. 2 is a flow diagram showing an overall concept and design validation procedure of a system-on-a-chip (SoC) IC in accordance with the present invention.

The overall flow of the SoC design validation method of the present invention is shown in FIG. 2. The validation method is based upon a 4-step systematic procedure to verify individual cores, interconnect therebetween regarding on-chip bus and glue logic, verify timing, and finally, verify the full system performance of SoC.

More specifically, in the step S31, the validation procedure first verifies individual cores by using silicon ICs and core functional testbenches. Then, the procedure moves to the next step S32 to verify interconnection among the cores including functions of on-chip bus and glue logic using FP FPGA/emulation unit for glue logic. In the next step S33, the validation method verifies timings in the cores by using simulation testbenches for core-to-core communication and SoC level critical paths. In the last step S34, the overall SoC design validation is tested by using full functional simulation testbenches and running application software.

Figure 3:
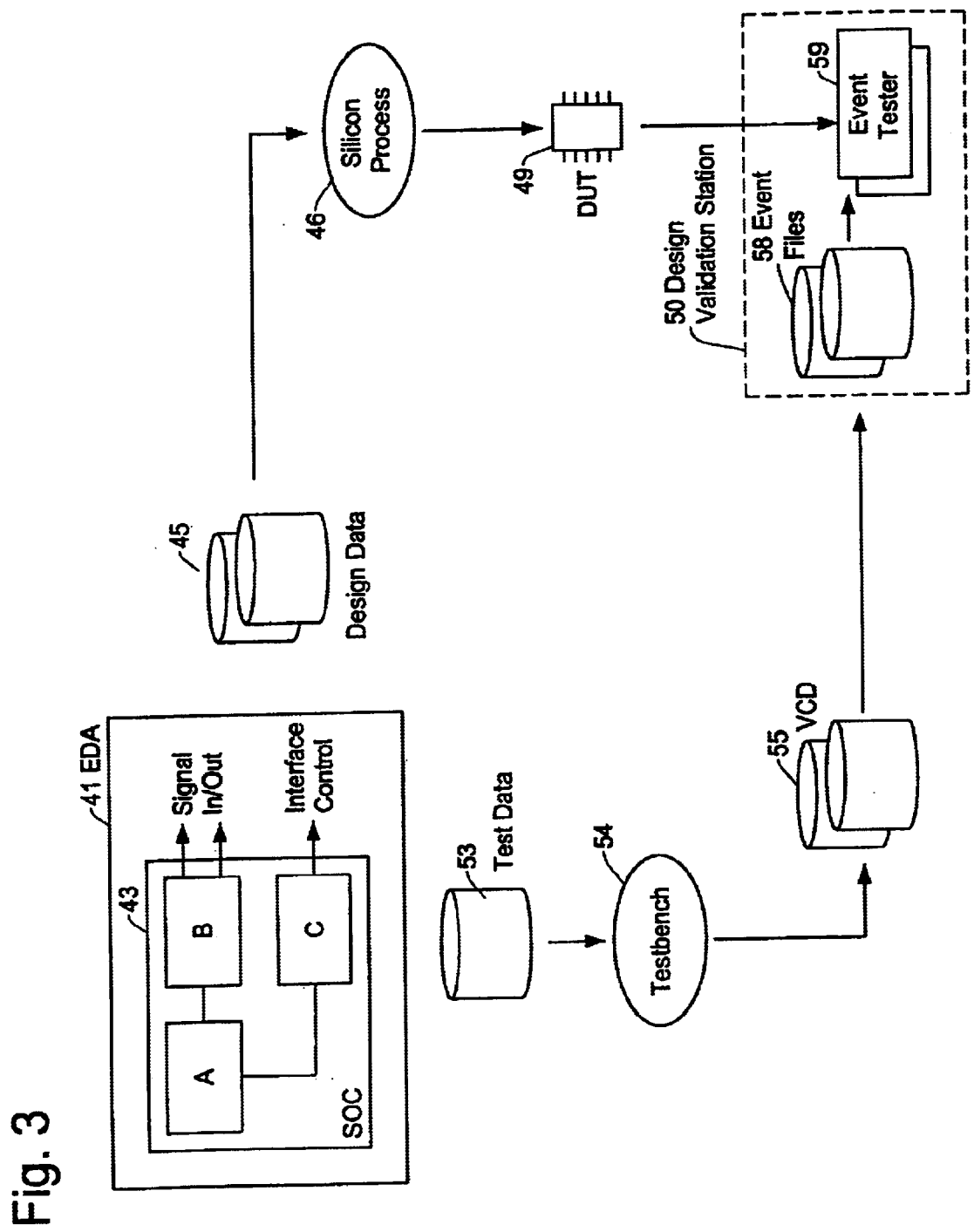
FIG. 3 is a schematic block diagram showing an overall concept of the design validation of the present invention including a relationship between an electronic design automation (EDA) environment and a design validation station of the present invention.

The method of the present invention is implemented with the apparatus shown in FIG. 3 that illustrates the overall concept of the new test system and the relationship with an electronic design automation (EDA) environment. The upper left of FIG. 3 shows an EDA environment where semiconductor devices such as an SoC 43 are designed with use of CAD tools. At the lower right of FIG. 3, the present invention is implemented in a design validation station 50. The design validation station 50 performs SoC design validation based on test data and design data produced in the design environment of SoC 43 to be tested as well as actual silicon ICs carrying the same structures and functions of the individual cores to be integrated in the SoC.

Figure 4A:
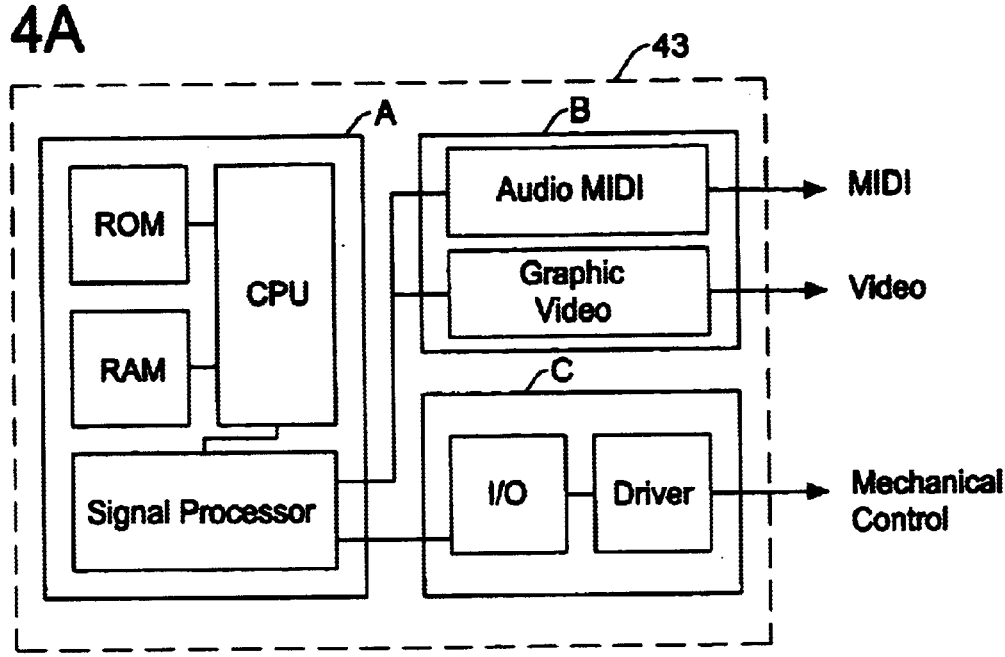
FIG. 4A is a block diagram showing an example of SoC designed in the EDA environment of FIG. 3.

In this example, the SoC 43 includes functional cores A, B and C, a more detailed structure is shown in FIG. 4A.

After designing the SoC 43 under the EDA environment 41, there obtained a design data file 45 and a test data file 53.

Through various data conversion processes, the design data 45 is converted to physical level data indicating each gate forming the designed semiconductor integrated circuit. Based on the physical level data, an actual SoC 49 is produced in a semiconductor IC fabrication process (silicon process). In the present invention, however, rather than directly testing the complete SoC, separate ICs representing individual cores in the SoC 43, such as cores A, B and C are utilized in the design validation station 50.

By executing a logic simulation by a testbench 54 with use of the test data 53 derived through the design stage of the SoC, a data file 55 such as Verilog/VCD file is created which shows input-output relationships in individual cores and/or overall system of SoC. As will be explained later, the data in the VCD file 55 is in an event base format. The data in the VCD file 55 is transferred to event files 58 in the design validation station 50. The design validation station 50 includes a plurality of event testers 59 (validation units 66 of FIG. 4B) to conduct the test in the above noted procedure of FIG. 2.

Figure 4B:
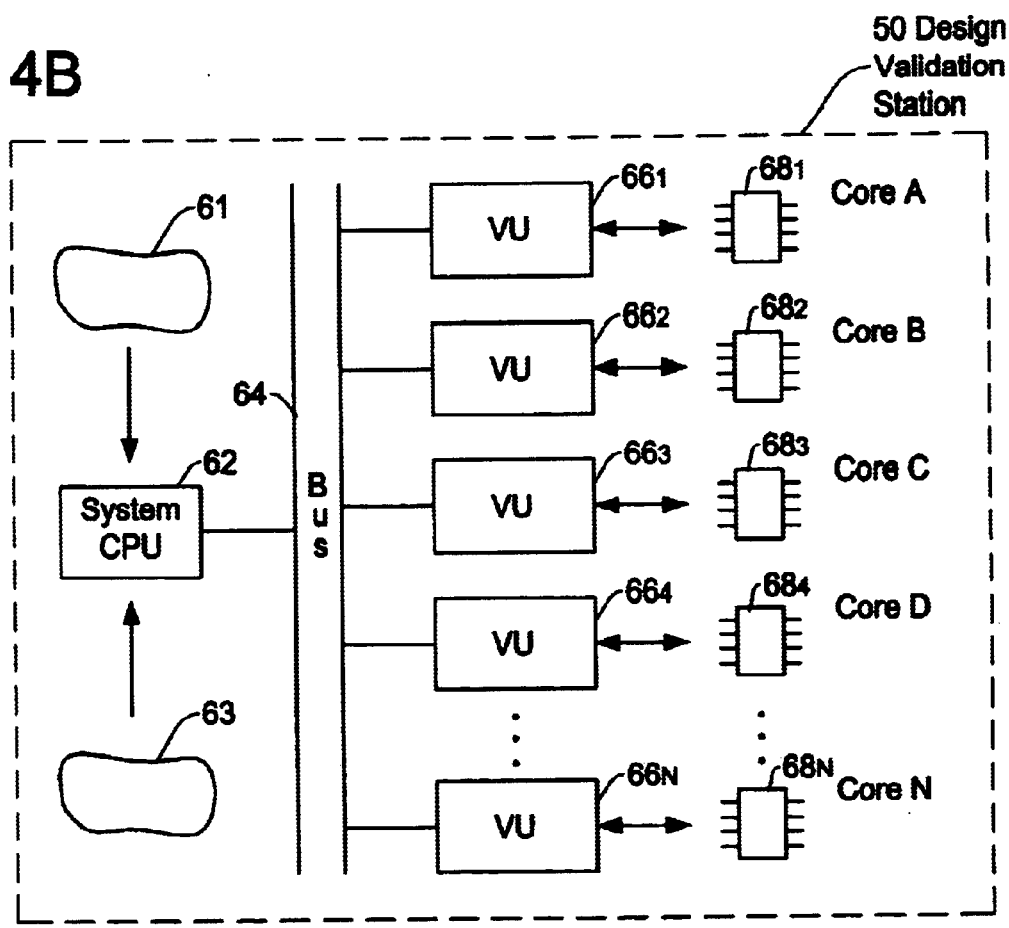
FIG. 4B is a block diagram showing an example of basic configuration in the design validation station of FIG. 3.

An example of basic structure in the design validation station 50 is shown in the schematic diagram of FIG. 4B for software/hardware co-development/verification. The design validation station 50 includes a plurality of verification units (VU) $66_1$–$66_N$ which are reconfigurable depending on pins of devices to be tested. The verification units $66_1$–$66_N$ are allocated to silicon ICs $68_1$–$68_N$ which [carry] are physical semiconductor devices carrying the function and circuit structure of the corresponding cores A–N to be integrated in the SoC to be evaluated.

A main system CPU 62 controls an overall operation of the validation procedure. The main system CPU 62 and the verification units $66_1$–$66_N$ are connected with one another through a system bus 64. Prior to the start of validation procedure, the main system CPU 62 is provided with the design data 61 and testbench data 63 derived from the design stage of each of the cores A–N.

Figure 5:
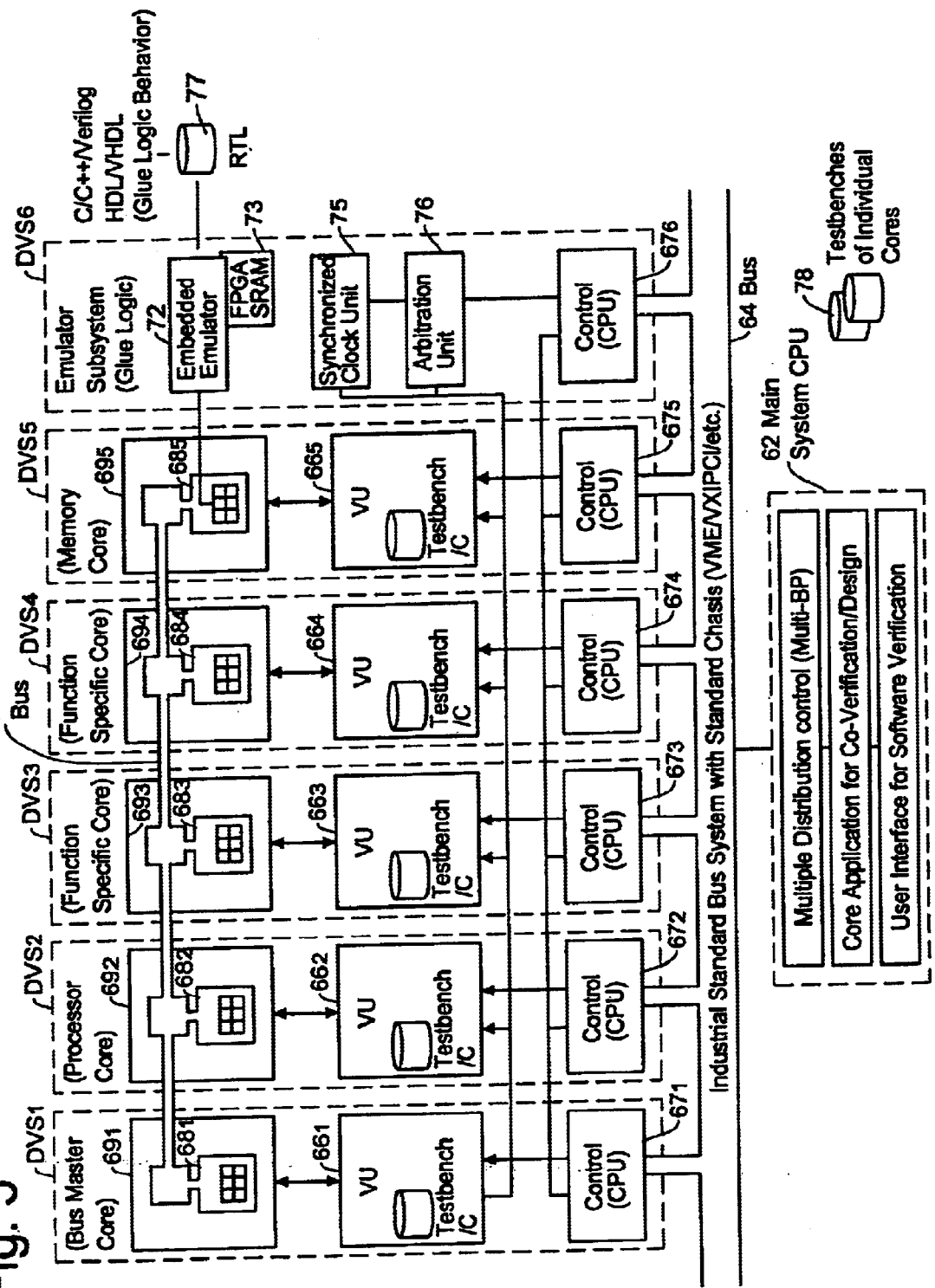
FIG. 5 is a block diagram showing a more detailed example of configuration in the design validation station of the present invention wherein a plurality of verification units (VU) are provided.

Further details of the design validation station 50 is shown in FIG. 5 wherein the design validation station is shown by a plurality of design validation stations $DVS_1$–$DVS_6$ only for an illustration purpose. This example shows the case where an SoC having cores A–E and glue logic is evaluated in its design validity. In this example, the validation station $DVS_1$ is configured to test "bus master core" (core A), the validation station $DVS_2$ is configured to test a "processor core" (core B), the validation stations $DVS_3$ and $DVS_4$ are configured to test "function specific cores" (cores C and D), and the validation station $DVS_5$ is configured to test a "memory core" (core E). Similarly, the validation station $DVS_6$ is configured to test "glue logic" in the SoC. In the present invention, the above noted cores A–E are formulated in the separate silicon ICs $68_1$–$68_5$, rather than actual cores, for design validation purpose.

As shown in FIGS. 4B and 5, the system contains a bus based architecture. The system bus 64 can be an industry standard bus such as VME, VXI or PCI bus that allows data transfer from the main system CPU 62 to the pins of verification units (VUs) $66_1$–$66_5$. The system pins are configurable by the user, i.e., a user can group test pins of the validation units (VUs) according to the I/Os of silicon ICs $68_1$–$68_5$, representing the individual cores A–E. The silicon ICs $68_1$–$68_5$ are mounted on pin electronics and device load boards (hereafter "pin electronics") $69_1$–$69_5$ and are connected to one another via an interconnect bus 71.

As shown in FIG. 5, each pin-group (assigned verification unit) also contains a control CPU 67 that controls the data flow, application of simulation data to the silicon ICs $68_1$–$68_5$, response comparison, scheduling of various tasks for individual blocks/cores as well as monitoring the status of individual cores (silicon ICs) and SoC. The control CPUs $67_1$–$67_6$ are connected with one another. The control CPUs $67_1$–$67_6$ are also connected to the main system CPU through the bus system 64. In the design validation station $DVS_6$ for glue logic, a synchronization unit 75 and an arbitration unit 76 are provided to promote data transfer to and from the main system CPU 62 and the control CPUs $67_1$–$67_6$ of design validation stations $DVS_1$–$DVS_6$.

Prior to the validation process, the main system CPU 62 installs the individual testbench data 78 and distributes the testbench data to the verification units (VUs) $66_1$–$66_N$. The main system CPU 62 controls an overall procedure in the design validation including user interface, software application run on cores for co-verification of design, and multiple distribution control for verification units. In each design validation station DVS, the verification unit (Vu) 66 applies test patterns produced based on the testbench data to the corresponding silicon IC 68 of the core. In other words, the physical silicon devices, rather than software simulated devices, are tested by actual electric test signals, rather than testbenches. Preferably, each verification unit (VU) 66 is configured as an event tester as will be explained later with reference to FIG. 6.

The events (test patterns) are applied to the DUT through the pin electronics 69 of FIG. 5. The pin electronics 69 physically connects the test pins to their assigned device pins of the silicon IC 68 (DUT). Basically, the pin electronics 69 includes an interface circuit for interfacing between the verification unit (VU) 66 and the silicon IC 68 to be tested. For example, each interface circuit is formed of one or more drivers and comparators (not shown) as well as a performance board. The driver is to apply the test pattern to an input pin of the DUT and the comparator compares a response output of the DUT with an expected value. The performance board is used to mechanically and electrically connect the DUT under test with the verification unit (VU) 66.

In the present invention, for verification of individual cores A–E, the silicon ICs $68_1$–$68_5$ of individual cores are utilized. Such silicon ICs 68 are generally available by the core provider companies as well as their fabrication partner companies. The whole system is reconfigured to map one verification unit 66 per core (silicon IC) as shown in FIGS. 4B and 5. For verification, the testbenches of individual cores are loaded on the main system CPU 62 with the I/O information of each core.

The main system CPU 62 reconfigures the system pins into one verification unit (VU) 66 per core (silicon IC) and assigns a control CPU 67. It should be noted that to enhance the system performance, one may implement this concept in one control CPU 67 per pin manner instead of one control CPU 67 per verification unit (VU) 66. Such implementation is a direct and natural enhancement of the system shown in FIGS. 4B and 5, and its description is avoided here.

Based upon the I/Os of the core, a configuration of the verification unit 66 may be anywhere between 64-to-256 pins in $2^N$ form. These pins are basically event tester channels and allow drive/compare operation. The system as shown in FIGS. 4B and 5 allows this reconfiguration of pins and maps them onto individual cores. Thus, in essence, the whole system is configured into multiple verification units 66, each mapped to one IP or core which is in the form of physical silicon IC as shown in FIG. 5. Thus, for each individual core (silicon IC), the assigned VU 66 appears to be a dedicated event based verification system. An example of event based verification system has been described in U.S. patent application No. 09/406,300 "Event Based Semiconductor Test System" [and U.S. Pat. No. 6,360,343 "Delta Time Event Based Test System"] which is now U.S. Pat. No.

6,532,561 and will be briefly described later. The event based simulation vectors of the core (for functionality and structural check) can be applied to the core (silicon IC 68) as well as its response can be observed and compared with the simulation data by this VU 66.

For core functional and timing verification, the main system CPU 62 passes the core simulation testbench data to the control CPU 67 of the associated verification unit (VU) 66.

This data is the design-simulation testbench of the core. It contains signal values and timing information to identify instances when signal value changes from 0-to-1 or 1-to-0, i.e., event based test patterns. Thus, no translation is necessary and the data (test pattern) is directly applied to the core (silicon IC 68).

As the data is design simulation data, a defect free core performs exactly as predicted by the simulation. This response is observed and compared by the control CPU 67 in the verification unit 66. Any deviation from the simulation is identified by the control CPU 67. This allows to know the presence of any fault in the core IC on any verification unit (VU) 66. This step allows to have a fault-free silicon IC of the core on a verification unit (VU) 66 before the SoC level design validation.

It should be noted that the method and apparatus of the present invention also allow a user to debug a fault in the core much more easily than the present day systems. This is because the environment of the present validation system is the same as the original design simulation environment, i.e, the EDA environment, with use of the event based data.

Verification Unit (Event Tester)

Figure 6:
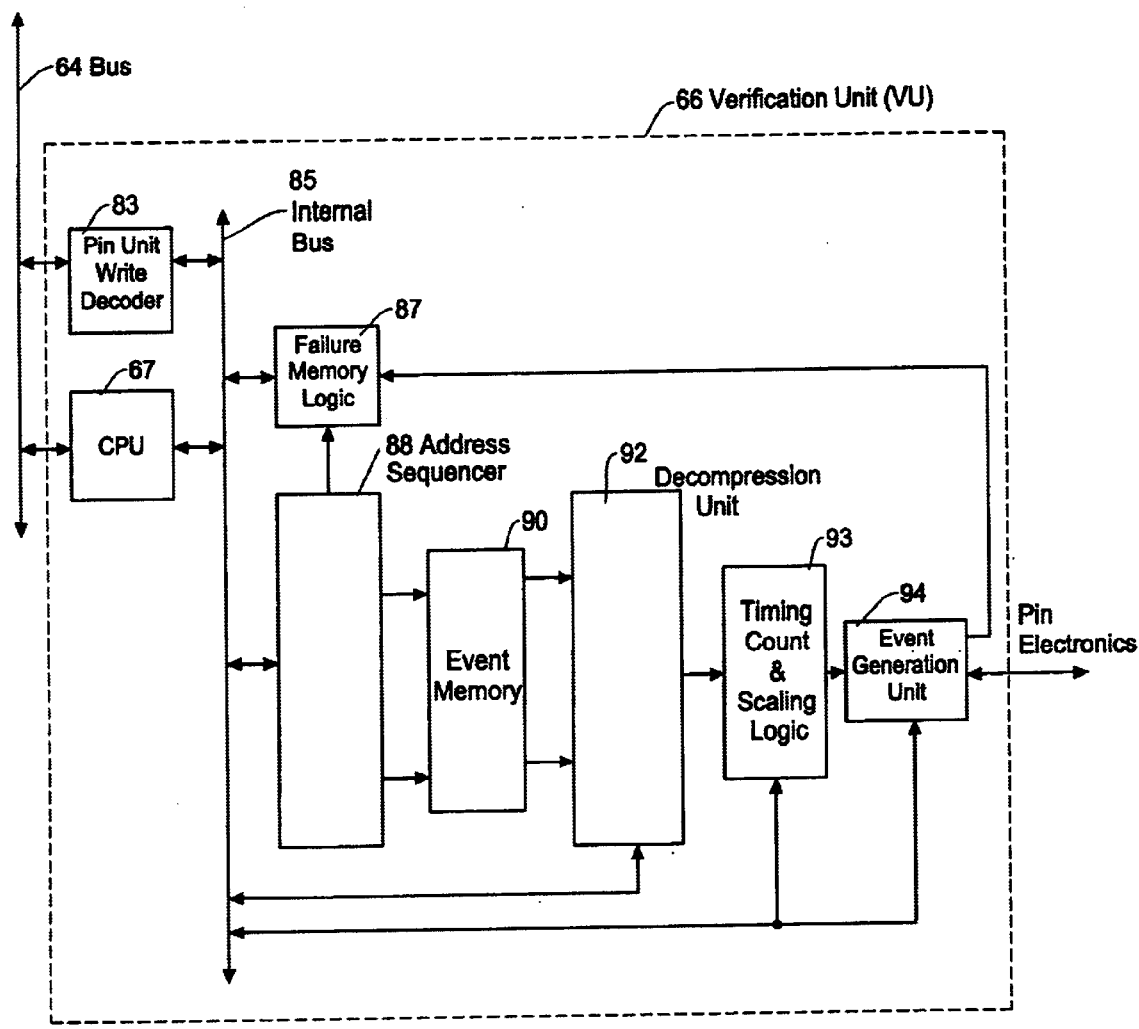
FIG. 6 is a block diagram showing an example of configuration in the verification unit (VU) of FIG. 5 which has a form of an event tester.

As noted above, each verification unit 66 in the present invention is configured as an event tester. An example of such an event tester is briefly explained with reference to FIG. 6. The more detailed description is given in the above noted U.S. patent application Ser. No. 09/406,300 "Event Based. Semiconductor Test System" [and U.S. Pat. No. 6,360,3443 "Delta Time Event Based Test System"] which is now U.S. Pat. No. 6,532,561, owned by the same assignee of this invention. In the event tester, a test pattern is described by signal value changes from 0-to 1 or 1-to-0 as a parameter of time length from a reference point. In the traditional cycle based test data, a test pattern is described by a combination of timing data, waveform data and vector data for each test cycle. Since today's design automation tools create event based test data when executing a logic simulation for the designed semiconductor device, an event based test system is able to directly use the simulation data produced in the design stage of the semiconductor device. amended as follows:

In the example of FIG. 6, the verification unit 66 includes a pin unit write decoder 83 and control CPU 67 connected to the pin-unit bus 63, an internal bus 85, an address sequencer 88, a failure memory 87, an event memory 90, a decompression unit 92, a timing count and scaling logic 93, and an event generation unit 94. The verification unit 66 provides a test pattern to the silicon IC 68 carrying the function and structure of the intended core through a pin electronics.

The pin unit write decoder 83 is to show the identification of the verification unit 66 so that the main system CPU 62 can configure the verification units 66 by sending a group selection address to the system bus 64. The internal bus 85 is a bus in the hardware event tester and is commonly connected to most of the functional blocks such as the address sequencer 88, failure memory 87, decompression unit 92, timing count and scaling logic 93, and event generation unit 94.

As noted above, the control CPU 67 provides instructions to other functional blocks in the verification unit 66 based on the core testbench data from the main system CPU 62. The failure memory 87 stores test results, such as failure information of the silicon IC 68 of representing the core from the comparator (not shown), with the addresses information provided by the address sequencer 88. The information stored in the failure memory 87 is used in the failure analysis stage of the cores and SoC.

The address sequencer 88 provides address data to the event memory 90. The event memory 90 stores the timing data for each event. For example, the event memory 90 stores the event data in two separate manners, one for storing the timing data which is integer multiple of one cycle of a master (reference) clock, and the other for storing the timing data which is a fraction or fractions of one cycle of the reference clock.

Preferably, the timing data in the event memory 90 is compressed to reduce the required memory capacity. The decompression unit 92 receives the compressed data from the event memory 90 and reproduce the timing data by a decompression process. The decompressed timing data is provided to the timing count and scaling logic 93.

The timing count and scaling logic 93 produces the current event based on timing data from the event memory 90. The overall timing data may be produced by summing the current timing data with previous timing data. The timing count and scaling logic 93 also function to modify the timing data in proportion to a scaling factor. Such a scaling operation of the timing data consists of multiplying timing data (each delta time or absolute time) by a scaling factor. The event generation unit 94 generates the real-time event signals based on the overall timing data from the timing count and scaling logic 93. The event generation unit 94 provides the event signals (test patterns) to the pin electronics 69.

Interface, On-Chip Bus and Glue Logic Verification

A large percentage of SoC design consists of predesigned cores, however, there is always some logic that is designed by the core integrator (SoC designer) to perform some very specific functions as well as to connect various cores. This logic is commonly called "Glue Logic". Traditionally, the glue logic has been implemented through custom design, however, recently embedded FPGAs (field programmable gate array) have been proposed to implement such logic. As mentioned above, in today's technology, a grossly incomplete verification is done of this logic.

In the proposed method, verification of this logic is done by the dedicated sub-system as indicated in FIG. 5 by the design validation station $DVS_6$ for verification of glue logic. The basic methodology is as follows:

(1) Use interconnect bus 71 that connects various silicon ICs 68 as shown in FIG. 5 to model the SoC on-chip bus. This is a system bus that connects various cores A–E which models the behavior of the on-chip bus. This maps instruction and data flow at an SoC level (from one core to another core) onto instruction and data flow at a design validation station level (from one VU to another VU). Hence, this bus captures any request/grant protocol of the SoC on-chip bus as well as all data transactions at each interface of the individual cores.

(2) Use an FPGA (field programmable gate array) that implements the glue logic on a dedicated sub-system. An alternate approach is to emulate the glue logic on dedicated sub-system. Both of these approaches are shown in FIGS. 7 and 8, respectively.

Figure 7:
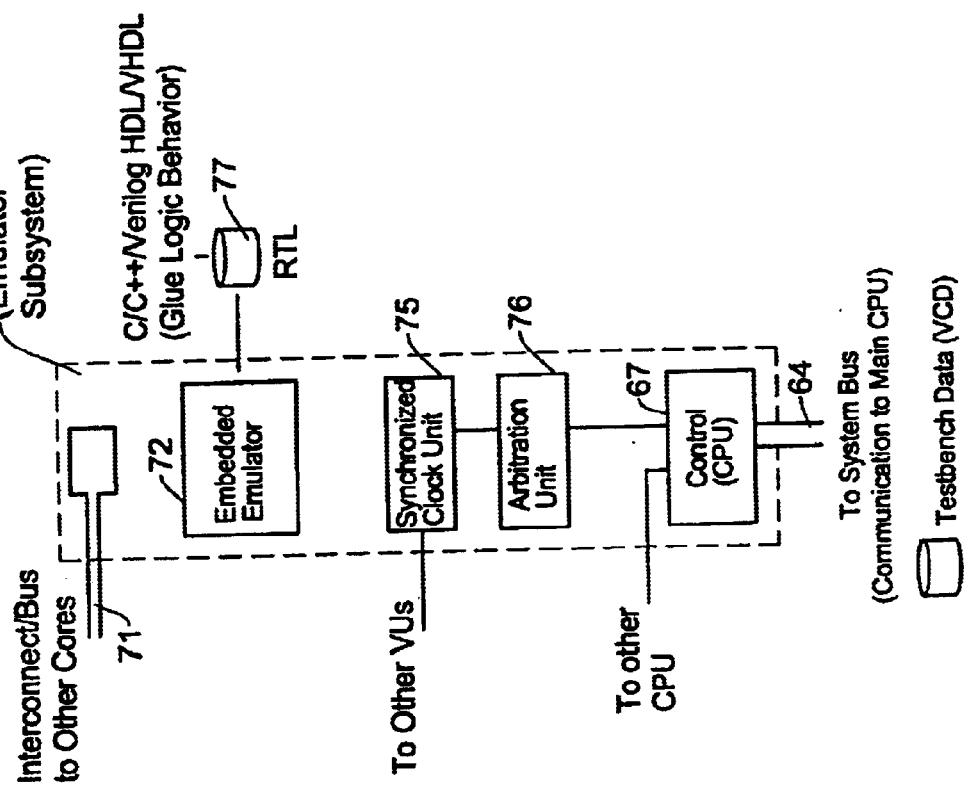
FIG. 7 is a block diagram showing an example of structure in the verification unit for evaluating glue logic in the SoC under test.

FIG. 7 shows the emulator sub-system. In this approach, any commercial emulator system can be used. In FIG. 7, the emulator 72 is loaded with the synthesizable RTL of glue logic and with the testbench data in the glue logic testbench file 77. The synchronization unit and arbitration units are used with commercial emulator to interface it with other VUs 66. The control CPU 67 performs the synchronization and communication tasks with the main system CPU 62.

Figure 8:
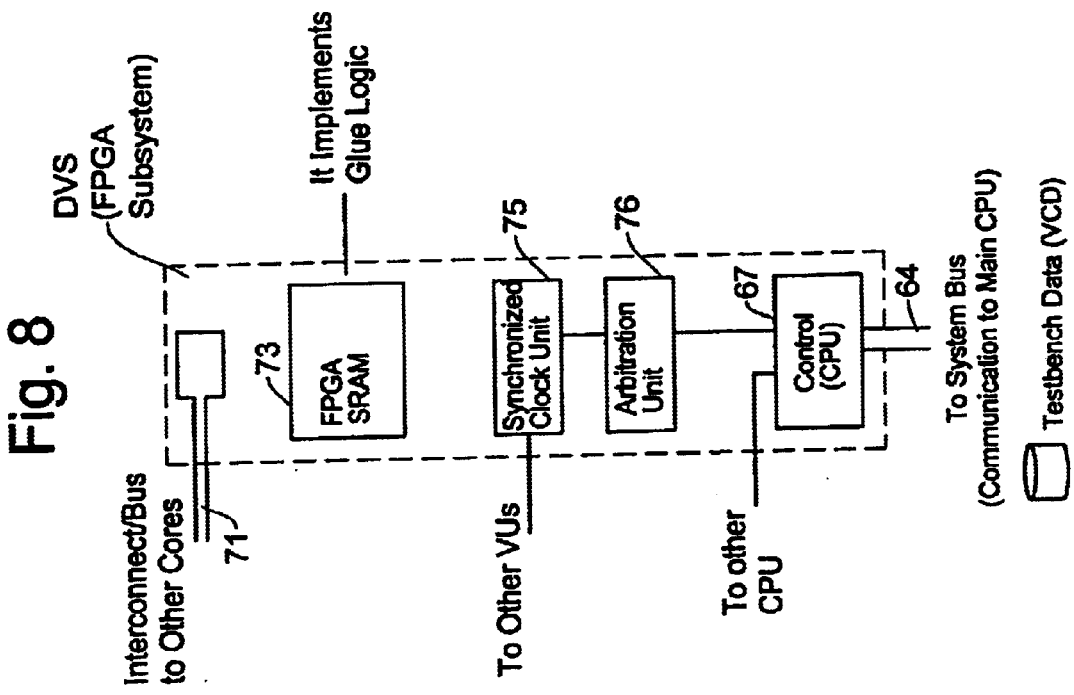
FIG. 8 is a block diagram showing another example of structure in the validation unit for evaluating the glue logic in the SoC under test.

FIG. 8 shows the FPGA approach. In this approach, the glue logic design is implemented using an FPGA 73 and the FPGA 73 is treated as a silicon IP or core. If the glue logic is implemented in the SoC by an embedded FPGA, then this FPGA 73 is just a stand-alone replica of the embedded FPGA (glue logic). This FPGA 73 is used as an independent IP and assigned to a dedicated verification unit VU.

If the glue logic is implemented in the SoC by custom design, then the RTL of glue logic is implemented on a stand-alone FPGA that is used on a dedicated VU. In this case, in majority of times, the speed of FPGA is slower than the custom glue logic in the SoC. Hence, this dedicated unit requires additional synchronization unit 75 and bus arbitration unit 76. Besides slow operational speed, this VU is identical to any other VU as well as it's operation is similar to any other VU.

Timing Verification

Once functionality of the individual cores, interface and glue logic is verified, timing verification is checked at SoC level critical paths. It should be noted that after completion of the steps 31 and 32 of FIG. 2, all individual pieces of SoC and interconnection are available on the design validation station of the present invention. The individual core's functionality and glue logic have been verified as well as timings of the individual cores have been verified. Hence, SoC level simulation testbenches as well as full applications can be run on the overall system, and in the case of any error, it can be concluded that the error exists in the integration of the cores.

In the method of the present invention, it is preferable to run a small number of SoC level simulation vectors (testbench) that verify correctness of core-to-core timings and correctness of timing critical paths at the SoC level. For this purpose, the SoC level simulation testbench is loaded on the main CPU. During SoC design, such simulation testbenches are developed to exercise the timing critical paths of the designs. The data of these testbenches (vectors) are in the event form, and in today's technology, the testbenches are generally available in the VCD (value change dump) format that is obtained from a Verilog/VHDL simulator.

The vectors in the testbench data exercise various timing critical paths in SoC connecting different parts of SoC. As described, the design validation station of the present invention has all components of SoC, it is expected that the simulation testbench for timing verification will execute and produce results identical to the simulation. Any deviation from the simulation results identifies an error, that is debugged easily in the event based environment of this invention that is commensurate to design simulation environment.

Verification of SoC or Overall Design Validation

For full functional verification of SoC as a system, the SoC level functional vectors developed during design-simulation are executed on the design validation station. These vectors are also in the event form. Many times, these vectors are generated by the software application running on the SoC design (Verilog/VHDL RTL model or behavioral model). These vectors exercise different parts of SoC simultaneously or at different time, however, so that the overall behavior of SoC is determined by the combined response.

Figure 9:
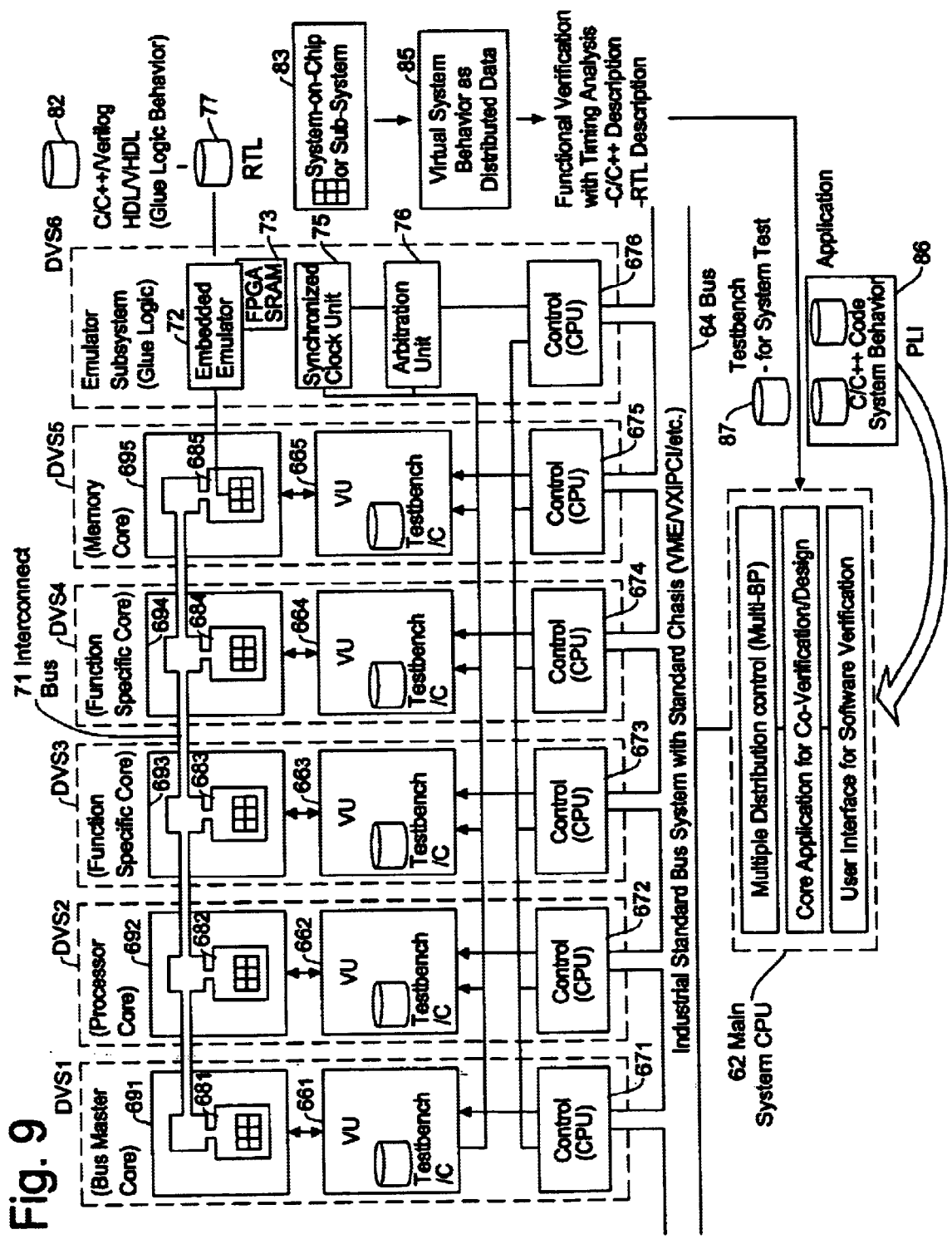
FIG. 9 is a block diagram showing another example of design validation station of the present invention which supports high level application languages.

When the application program is in a higher level language such as a C/C++ language or in a binary form, an API (application program interface) and PLI (program language interface) are required to load these programs on the main system CPU 62 as well as for the communication between outside world and the main system CPU 62, as is shown in FIG. 9.

To achieve this, the main system CPU 62 contains a multiple distribution control with multiple bus protocol (shown as multi-BP in FIGS. 5 and 9). It performs a "Fork" operation on the application task (software application) to break it into multiple sub-tasks, schedule them and assign these sub-tasks to different VUs 66 that are mapped to individual cores. It should be noted that this "Fork" operation is performed on the application software that is in a high level language such as Verilog/VHDL or even C/C++ language. Thus, the system compiler with multiple distribution control can perform "Fork" on the application task to execute it in a distributed computing environment made up of the multiple verification units 66.

After this "Fork" operation, the sub-tasks are distributed to individual VUs 66 through the system bus 64. The control CPU 67, arbitration unit 76 and synchronization clock unit 75 allow the communication and error-free data transfer from the main system CPU 62 to control CPUs 67 of the individual VUs 66. This architecture with the main system CPU 62, arbitration unit 76 and synchronization clock unit 75 is shown in FIG. 9.

Based upon the sub-task assignments, the control CPUs 67 apply event-based vectors to the individual cores and collect response therefrom. This response is passed to the main system CPU 62, again using the control CPU, bus arbitration poll unit and synchronization unit for error-free data transfer. The main system CPU 62 performs a "Join" operation to merge various responses and to form an SoC level response. This response is compared with the simulation response to determine if SoC performed correct operation. If this is an application run, then this response is the expected outcome of the application. For example a video application run should result in display of a picture frame. Any deviation from the simulation data or expected application output is identified by the main system CPU 62 and easily debugged by the design engineer because the environment is event based that is the same as the original design environment.

Fixture or Performance Board

Figure 10:
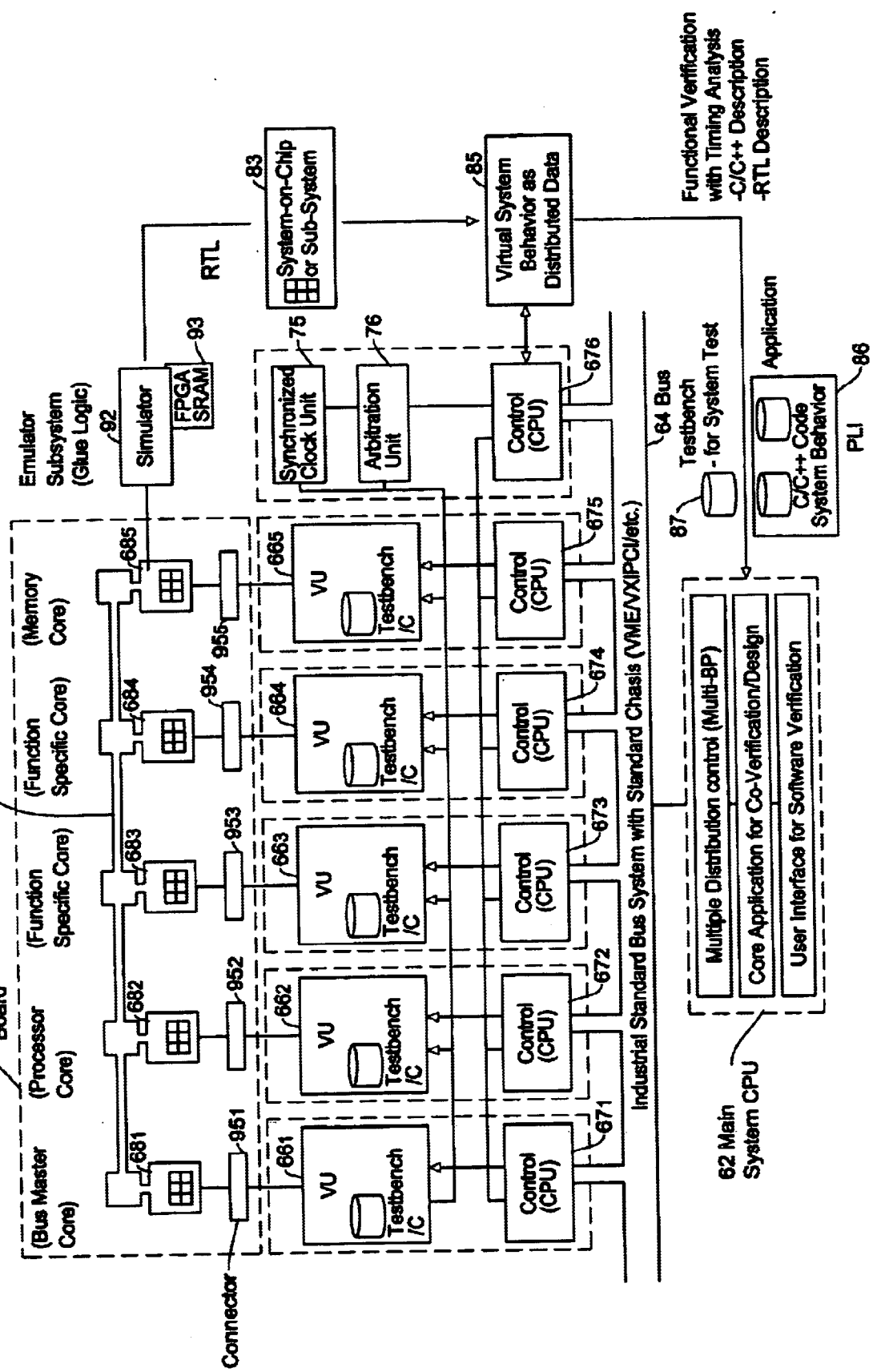
FIG. 10 is a block diagram showing a further example of design validation station of the present invention which shows a structural relationship with a performance board for mounting functional cores to be tested.

The design validation station of the present invention requires a performance board through which the silicon ICs 68 representing the intended cores and the glue logic FPGA are interfaced. In the example of FIGS. 5–9, a device load board or performance board 69 is. provided per core (each design validation station DVS). A block diagram of FIG. 10 shows another example of structure regarding the performance board. In this example, a performance board 90 contains all of the cores (silicon ICs) and glue logic (FPGA) to be tested. Connectors 95 are provided between VU 66 and the silicon ICs (cores) 68 for connecting the same.

This performance board 90 is very similar to the performance board of a conventional tester, that is a multi-layered printed circuit board. The primary difference of this performance board 90 and the tester performance board is that tester performance board carries only one DUT, while this performance board 90 in the design validation station of the present invention carries the silicon ICs 68 of all cores and the glue logic FPGA.

Figure 11:
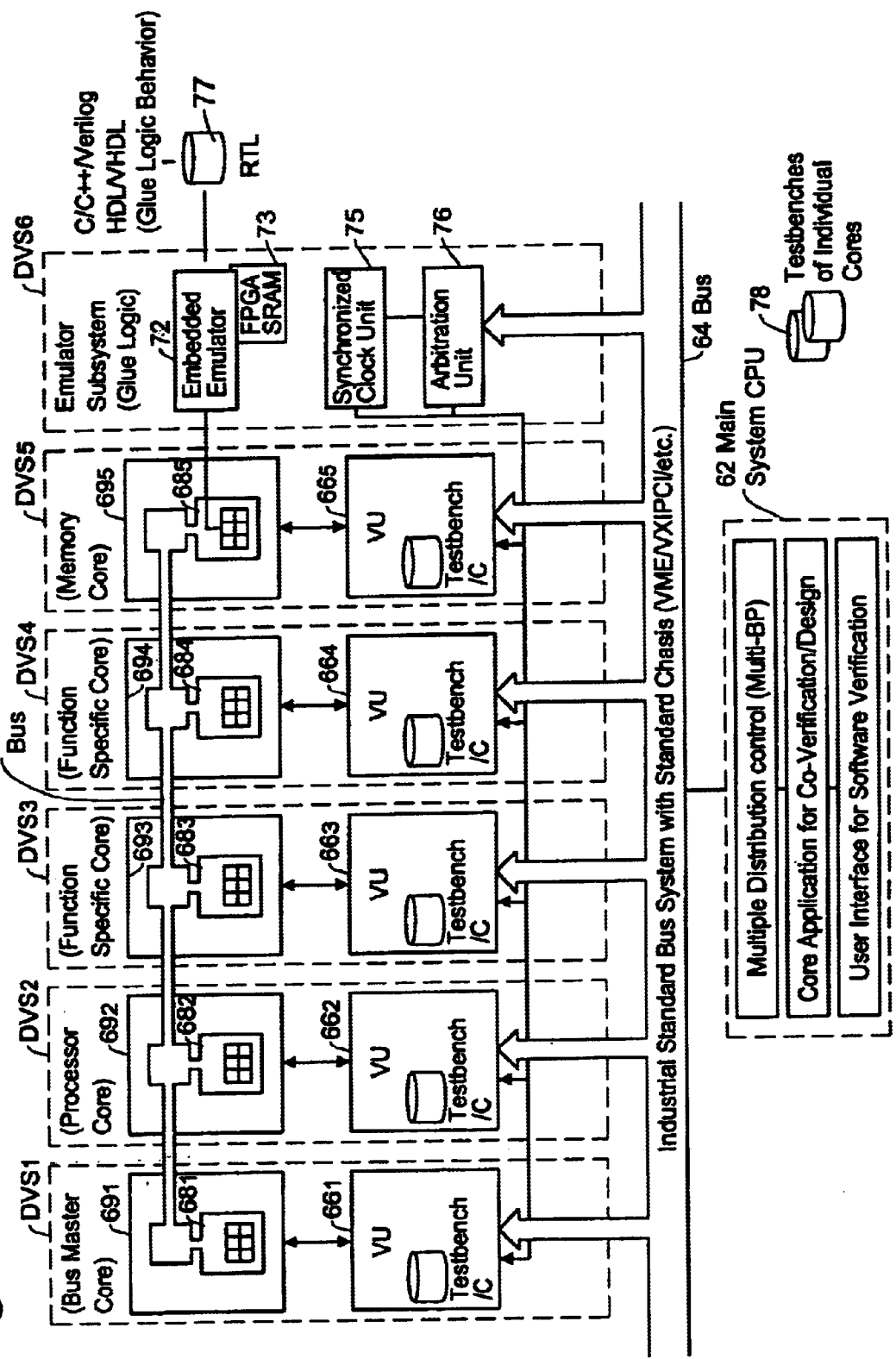
FIG. 11 is a block diagram showing a further example of design validation station of the present invention wherein a plurality of verification units (VU) are directly controlled by the main system computer.

FIG. 11 shows a further example of design validation station of the present invention wherein a plurality of verification units (VU) are directly controlled by the main system computer. In this example, unlike the previous examples, each design validation station does not include control CPU but directly controlled by the main system computer 62 through the system bus 64. Thus, all tasks such as synchronization, response evaluation of cores, timing evaluation, and overall SoC evaluation, etc., are carried out by the main system computer 62.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method for design validation of an embedded cores based SoC (system-on-a-chip) in which a plurality of functional cores are integrated, comprising the following steps of:

producing a plurality of silicon ICs where each silicon IC has a function and circuit structure identical to that of a corresponding core to be integrated into an SoC whose design is validated;

mounting the silicon ICs on a plurality of verification units where each verification unit is a hardware tester and wherein each silicon IC is connected to a corresponding verification unit through a pin electronics having a driver and a comparator;

verifying individual cores to be integrated in the SoC by evaluating performances of the silicon IC corresponding to each core by applying core specific test pattern signals to the silicon IC through the drivers and evaluating resultant outputs from the silicon ICs by the comparators, wherein the core specific test pattern signals are generated with use of simulation testbenches produced through a design stage of the cores;

verifying interfaces between the individual cores, on-chip buses of the cores and glue logic by applying interface test signals therebetween, wherein the interface test signals are generated with use of simulation testbenches developed by an SoC designer and FPGA/emulation of the glue logic;

verifying core-to-core timings and SoC level timing critical paths by evaluating performances of the silicon IC corresponding to each core; and performing an overall design validation by evaluating overall performances of the plurality of silicon ICs by applying overall performance test pattern signals to the plurality of silicon ICs and evaluating resultant outputs from the silicon ICs where the overall performance test pattern signals are generated with use of simulation testbenches of an overall SoC and application runs.

2. A method for design validation as defined in claim 1, wherein the verifying steps are conducted after assigning a plurality of verification units to the silicon ICs representing the function and structure of the individual cores and mounting the silicon ICs on the corresponding verification units.

3. A method for design validation as defined in claim 1, wherein the verifying steps are conducted after assigning a plurality of verification units to the silicon ICs representing the function and structure of the individual cores and mounting the silicon ICs on the corresponding verification units wherein test pins of the verification units are configured with reference to input/output pins of the silicon ICs under test.

4. A method for design validation as defined in claim 1, wherein the verifying steps are conducted after assigning a plurality of verification units to the silicon ICs representing the function and structure of the individual cores and mounting the silicon ICs on the corresponding verification units wherein each of the verification units is configured as an event based tester which generates the test pattern signals based on event data which describes the test pattern by value changes and their timings extracted from the simulation testbenches.

5. A method for design validation as defined in claim 4, wherein the simulation testbench of the individual cores has an event based data format, thereby facilitating a procedure to generate the test pattern signals for debugging of a fault in the cores of the SoC by the verification unit.

6. A method for design validation of an embedded cores based SoC (system-on-a-chip) in which a plurality of functional cores are integrated, comprising the following steps of:

producing a plurality of silicon ICs each having a function and circuit structure of a corresponding core to be integrated into an SoC;

providing a plurality of verification units and assigning each of the verification units to each of the silicon ICs corresponding to each of the cores;

mounting the silicon ICs on the plurality of verification p units where each verification unit is a hardware tester and wherein each silicon IC is connected to a corresponding verification unit through a pin electronics having a driver and a comparator;

interconnecting the silicon ICs by an interconnect bus modeling an on-chip bus designed in the SoC for connecting between the cores;

verifying the cores to be integrated in the SoC by applying test patterns to the silicon ICs through the drivers and monitoring response output of the silicon ICs by the comparators and the verification units; and wherein the test patterns are directly produced by using event data in the simulation testbench data produced in a design stage of the cores.

7. A method for design validation as defined in claim 6, further including a step of verifying interface between the silicon ICs representing functions and structures of the cores and glue logic to be integrated in the SoC by emulating the interface and glue logic by an emulator.

8. A method for design validation as defined in claim 6, further including a step of verifying interface between the silicon ICs representing functions and structures of the cores and glue logic to be integrated in the SoC by implementing functions of the interface and glue logic by a field programmable gate array (FPGA).

9. A method for design validation as defined in claim 6, further including a step of verifying core-to-core timings and SoC level timing critical paths by providing test stimulus produced based on SoC level testbench data to the silicon ICs representing functions and structures of the individual cores.

10. A method for design validation as defined in claim 6, further including a step of performing an overall design validation by evaluating an overall performance of the plurality of silicon ICs by applying SoC test patterns to the plurality of silicon ICs, wherein the SoC test patterns are produced with use of simulation testbenches of an overall SoC and application runs.

11. A method for design validation as defined in claim 6, wherein the verifying steps are conducted after assigning a plurality of verification units to the silicon ICs representing functions and structures of the individual cores and mounting the silicon ICs on the corresponding verification units.

12. A method for design validation as defined in claim 6, wherein the verifying steps are conducted after assigning a plurality of verification units to the silicon ICs representing functions and structures of the individual cores and mounting the silicon ICs on the corresponding verification units, wherein each of the verification units is configured as an event based tester which generates a test pattern based on event data which describes the test pattern by value changes and their timings.

13. A method for design validation as defined in claim 12, wherein the simulation testbench of the individual cores has an event based data format, thereby facilitating a procedure to generate the test pattern signals for debugging of a fault in the cores of the SoC by the verification unit.

14. A method for design validation as defined in claim 6, wherein the verifying steps are conducted after assigning a plurality of verification units to the silicon ICs representing functions and structures of the individual cores and mounting the silicon ICs on the corresponding verification units, wherein test pins of the verification units are configured with reference to input/output pins of the silicon ICs under test.

15. An apparatus for design validation of an embedded cores based SoC (system-on-a-chip) in which a plurality of functional cores are integrated, comprising:
   a main system computer for interfacing with a user and controlling an overall operation of an apparatus for design validation;
   a plurality of verification units which receives testbench data from the main system computer and generates test patterns using the testbench data for testing a plurality of functional cores to be integrated in an SoC by evaluating a plurality of physical silicon ICs produced separately from the functional cores, wherein each of the verification units includes a control computer which receives the testbench data from the main system computer;
   a system bus interfacing the main system computer with the plurality of verification units; and
   wherein the plurality of silicon ICs are connected to the verification units through pin electronics having drivers and comparators to receive the test pattern from the verification units through the drivers and response outputs of the silicon ICs are evaluated by the comparators and the verification units and main system computer, and wherein each of the silicon ICs has a structure and function identical to that of the corresponding one of the functional cores to be integrated in the SoC.

16. An apparatus for design validation as defined in claim 15, wherein the control computer in each of the verification units produces the test patterns for the silicon IC allocated to the verification unit based on the testbench data from the main system computer through the system bus, applies the test patterns to the silicon IC, and evaluates the response output of the silicon IC, wherein the testbench data are produced through a design stage of the functional cores.

17. An apparatus for design validation as defined in claim 15, wherein each of the verification units is assigned to one of the silicon ICs representing the functional cores.

18. An apparatus for design validation as defined in claim 15, wherein each of the verification units is assigned to one of the silicon ICs representing the functional cores to be integrated in the SoC, and wherein test pins of the verification units are configured with reference to input/output pins of the silicon ICs.

19. An apparatus for design validation as defined in claim 15, wherein each verification unit has a group of test pins, and a pin configuration of the verification unit is freely changed depending on a pin configuration of the silicon IC under test.

20. An apparatus for design validation as defined in claim 15, wherein each verification unit has a group of test pins, and a pin configuration of the verification unit is freely changed depending on a pin configuration of the silicon IC under test, and wherein a size of the group is determined by the main system computer based upon a number of input/output pins of the silicon IC assigned to the verification unit.

21. An apparatus for design validation as defined in claim 15, wherein each of the verification units includes a control computer which receives the testbench data from the main system computer through the system bus and produces the test patterns by extracting event data from the testbench data, applies the test patterns to the silicon IC allocated to the verification unit and evaluates the response output of the silicon IC, and wherein the control computer is provided for each test pin of the verification unit, and wherein the testbench data is produced through a design stage of the functional cores.

22. An apparatus for design validation as defined in claim 15, wherein the verification unit evaluates the assigned silicon IC to verify design integrity of the corresponding functional core, and the verification units further evaluate the interface between the silicon ICs representing the functional cores and glue logic to be integrated in the SoC by emulating the interface and glue logic by an emulator.

23. An apparatus for design validation as defined in claim 15, wherein the verification unit evaluates the assigned silicon IC to verify the corresponding functional core, and the verification units further evaluate the interface between the silicon ICs representing the functional cores and glue logic to be integrated in the SoC by implementing functions of the interface and glue logic by a field programmable gate array (FPGA).

24. An apparatus for design validation as defined in claim 15, wherein the main system computer and the verification units verify core-to-core timings and SoC level timing critical paths by applying test stimulus produced based on SoC level testbench data to the silicon ICs representing the functions and structures of the individual cores.

25. An apparatus for design validation as defined in claim 15, wherein the main system computer and the verification units verify an overall SoC design by evaluating an overall performance of the plurality of silicon ICs with use of simulation testbenches of an overall SoC and application runs.

26. An apparatus for design validation as defined in claim 15, wherein the main system computer and the verification units verify an overall SoC design by evaluating an overall performance of the plurality of silicon ICs with use of simulation testbenches of an overall SoC and application runs, and wherein the main system computer distributes partition SoC software application computations to the verification units by breaking the computations into multiple sub-tasks and assigning the sub-tasks in a distributed fashion on the plurality of verification units.

27. An apparatus for design validation as defined in claim 15, wherein the main system computer and the verification units verify an overall SoC design by evaluating an overall performance of the plurality of silicon ICs with use of simulation testbenches of an overall SoC and application runs, and wherein the main system computer distributes partition SoC software application computations to the verification units by breaking the computations into multiple sub-tasks and assigning the sub-tasks in a distributed fashion on the plurality of verification units, and wherein the main computer combines responses of the silicon ICs from the verification units to form an SoC level response to determine any error/failure.

28. An apparatus for design validation as defined in claim 15, further including a performance board which mounts the corresponding silicon IC thereon in each of the verification units.

29. An apparatus for design validation as defined in claim 15, further including a performance board which mounts all of the silicon ICs and glue logic under test.

30. An apparatus for design validation as defined in claim 15, wherein each of the verification units is configured as an event based tester which generates the test pattern based on event data which describes the test pattern solely by value changes and their timings.

31. An apparatus for design validation as defined in claim 30, wherein the simulation testbench of the individual cores has an event based data format, thereby facilitating a procedure to generate the test pattern signals for debugging of a fault in the cores of the SoC by the verification unit.

32. An apparatus for design validation as defined in claim 15, wherein each of the verification units is configured as an event based tester which is comprised of:

an event memory for storing timing data of each event formed where the timing data is formed with an integer multiple of a reference clock period (integral part data) and a fraction of the reference clock period (fractional part data), the timing data being a time difference between a current event and a predetermined reference point;

an address sequencer for generating address data for accessing the event memory;

an event count logic for generating an event start signal which is determined by the reference clock period and a sum of the integral part data;

an event generation unit for generating each event based on the event start signal from the event count logic and the fractional part data for formulating the test pattern; and a pin unit write decoder for detecting an address of a verification unit for assigning the verification unit to the pins of the silicon IC.

33. An apparatus for design validation of an embedded cores based SoC (system-on-a-chip) in which a plurality of functional cores are integrated, comprising:

a main system computer for interfacing with a user and controlling an overall operation of an apparatus for design validation;

a plurality of verification units which receives testbench data from the main system computer and generates test patterns using the testbench data for testing a plurality of functional cores to be integrated in an SoC by evaluating a plurality of physical silicon ICs produced separately from the functional cores;

a system bus interfacing the main system computer with the plurality of verification units;

wherein the plurality of silicon ICs are connected to the verification units through pin electronics having drivers and comparators to receive the test pattern from the verification units through the drivers and response outputs of the silicon ICs are evaluated by the comparators and the verification units and main system computer, and wherein each of the silicon ICs has a structure and function identical to that of the corresponding one of the functional cores to be integrated in the SoC; and wherein the main system computer performs all tasks of generating test patterns to be supplied to the silicon ICs, evaluating response outputs of the silicon ICs, conducting timing and interface evaluation of the SoC, and an overall design validation of the SoC.

* * * * *